United States Patent
Tanaka et al.

(10) Patent No.: US 8,571,616 B2
(45) Date of Patent: Oct. 29, 2013

(54) MGB$_2$ COMPOUND SHEATH SUPERCONDUCTING WIRE AND MANUFACTURING METHOD OF THE SAME

(75) Inventors: Kazuhide Tanaka, Hitachi (JP); Michiya Okada, Mito (JP); Masazumi Hirakawa, Yokohama (JP); Hideyuki Yamada, Matsudo (JP)

(73) Assignees: Hitachi, Ltd., Tokyo (JP); Central Japan Railway Company, Aichi (JP)

( * ) Notice: Subject to any disclaimer, the term of this patent is extended or adjusted under 35 U.S.C. 154(b) by 1098 days.

(21) Appl. No.: 10/782,790

(22) Filed: Feb. 23, 2004

(65) Prior Publication Data

US 2004/0204322 A1 Oct. 14, 2004

(30) Foreign Application Priority Data

Apr. 11, 2003 (JP) ................. 2003-107553

(51) Int. Cl.
*H01F 6/00* (2006.01)
(52) U.S. Cl.
USPC ......................................... 505/230
(58) Field of Classification Search
USPC ......................................... 505/230
See application file for complete search history.

(56) References Cited

U.S. PATENT DOCUMENTS

| | | | |
|---|---|---|---|
| 5,043,320 A * | 8/1991 | Meyer et al. | 505/433 |
| 5,470,821 A * | 11/1995 | Wong et al. | 505/236 |
| 5,935,911 A * | 8/1999 | Yamada et al. | 505/230 |
| 6,337,307 B1 * | 1/2002 | Nakahara et al. | 505/232 |
| 6,995,119 B2 * | 2/2006 | Dunand | 505/124 |
| 2002/0173428 A1 | 11/2002 | Thieme et al. | |
| 2002/0198111 A1 * | 12/2002 | Tomsic | 505/230 |
| 2003/0036482 A1 * | 2/2003 | Thieme et al. | 505/100 |
| 2004/0121915 A1 * | 6/2004 | Tanaka et al. | 505/100 |

OTHER PUBLICATIONS

U.S. Appl. No. 60/295,447.*
B. A. Glowacki et al., "Superconductivity of powder-in-tube MgB$_2$ wires", Institute of Physics Publishing, Techno House, Apr. 2001, Bristol, GB, vol. 14, No. 4, pp. 193-199.
S. Jin et al., "High critical currents in Iron-clad superconducting MgB$_2$ wires", Nature, Nature Publishing Group, London, GB, May 31, 2001, vol. 411, No. 6837 pp. 563-565.
B.A. Glowacki and M. Majoros, "MgB$_2$ conductors for dc and ac applications", Physica C Aug. 2002 Elsevier Science B.V., vol. 372-376 pp. 1235-1240.
Hongli Suo et al., "Large transport critical currents in dense Fe-and Ni-clad MgB2 superconducting tapes", Applied Physics Letters, American Institute of Physics, Nov. 5, 2001, Melville, NY, vol. 79, No. 19, pp. 3116-3118.
H. Kumakura et al., "Critical current densities and irreversibility fields of MgB2 bulks", Physica C, North-Holland Publishing, 2001, Amsterdam, NL, vol. 363, No. 3, Elsevier Science B.V., pp. 179-183.

(Continued)

*Primary Examiner* — Paul Wartalowicz
(74) *Attorney, Agent, or Firm* — Dickstein Shapiro LLP (57) ABSTRACT

An MgB$_2$ compound sheath superconducting wire includes a high stable metal having a specific electric resistance 7 μΩcm or below at a room temperature and a high strength metal having a Vickers hardness 50 or above at a room temperature, both of which are assembled therewith to realize a high strength and a lengthy superconductor.

5 Claims, 9 Drawing Sheets

(56) References Cited

OTHER PUBLICATIONS

W. Goldacker and S.I. Schlachter, "Influence of mechanical reinforcement of MgB2 wires on the superconducting properties", Physica C, Elsevier Science B.V., Netherlands, Oct. 1, 2002, 889-893, vol. 378-381.

W. Golldacker, et al., "Mechanically Reinforced Mgb2 Wires and Tapes With High Transport Currents", Apr. 29, 2002, http://arrxiv.org/ftp/cond-mat/papers/0204/0204599.pdf, Forschungzentrum Karlsruhe, Institute fuer Technische Physik.

Gun Yong Sung, Sang Hyeob Kim Junho Kim,. "Microstructure of the highly dense MgB2 superconductor by transmission electron microscope", http://arrxiv.org/ftp/cond-mat/papers/0204/0204599.pdf, Mar. 3, 2001.

"Lecture General Description of Cryogenic Engineering/Superconductor Society", 66th Spring Session (2002), pp. 148, and translation.

* cited by examiner

MGB$_2$ COMPOUND SHEATH SUPERCONDUCTING WIRE AND MANUFACTURING METHOD OF THE SAME

BACKGROUND OF THE INVENTION

1. Field of the Invention

The present invention relates to an MgB$_2$ compound sheath superconducting wire capable of producing a high superconducting critical current density by using a superconductor causing superconductivity in an environment below the critical temperature and its manufacturing method.

More specifically, the present invention is applied to a current lead, a transmission line, a large-size magnet, a nuclear magnetic resonance analysis device, a medical MRI device, a superconducting power storage device, a magnetic separation device, a device for pulling crystal up in magnetic field, a superconducting magnet device used for cooling in refrigerator, a superconducting energy storage, a superconducting generator, a fusion reaction furnace magnet, and a magnetically levitated train.

2. Description of the Related Art

Conventionally, as a superconducting material, metal-based materials such as niobium titanium (NbTi) and niobium 3 tin (Nb$_3$Sn) are known. However, among these metal-based superconducting materials, even the niobium 3 germanium (Nb$_3$Ge) having the highest critical temperature is 23K (Kelvin) and there has been problem that it is necessary to use expensive liquid helium for cooling.

As for the high temperature superconductor, a lanthanum (La) oxide-based superconductor having the critical temperature of 30K was discovered in April, 1986. Since then, various copper oxide-based superconductors contain yttrium (Y)-based, bismuth (Bi)-based, thallium (Tl)-based, mercury (Hg)-based bodies having the critical temperature exceeding the boiling point of the liquid nitrogen (77K) have been discovered.

However, since these copper oxide-based superconductors are composed of so-called ceramics, they are therefore low workability to produce a lengthy and uniformly excellent line material, which is problem.

Moreover, since the copper oxide-based superconductor has a large magnetic field anisotropy, it is necessary to align the crystal orientation between the substrate or the sheath material and the superconducting layer. That is, it is necessary to use those having a small mismatch between the crystal orientation between the substrate or sheath material and the superconductor, and also use those orientated three axes of the crystal orientations. This is why the control for such requirements describe above is very difficult and there are a lot of problems for yield and cost.

In the 21st century, as is reported in Nature 410, 63-64 (2001), it was discovered that magnesium diboride (MgB$_2$) causes superconductivity at about 40K. Since this material has quite small magnetic field anisotropy, it is possible to obtain a high critical current density without aligning the crystal orientation with the substrate. Moreover, the material has an excellent bending characteristic. Even when 1.5% of distortion is applied to the superconducting wire, it is possible to maintain the critical current density of 90% with respect to the wire without distortion. This has been proved by an experiment made by the inventors of the present application.

Moreover, there is an advantage that the critical temperature is higher than that of the metal-based superconducting material by more than 20K. Cond-mat/0108265 reports that the upper critical magnetic field is about 40 T in a thin film. If these characteristics are utilized, application in a strong magnetic field is considered to be realistic.

Furthermore, it has been appreciated that this material has a significantly effective characteristic for practice that it is possible to obtain a practically critical current density only by mechanical processing. That is, it is possible to obtain a high superconductivity without performing thermal treatment in the manufacturing process. This characteristic is completely different from that of the conventional superconducting wire which does not cause a superconducting phenomenon without applying thermal treatment. This characteristic can be used for realizing the following:

(1) Reducing the manufacturing steps
(2) Increasing the selection range of the metal sheath material
(3) Improving degree of design freedom of the coil winding Accordingly, it is considered that it is possible to significantly reduce the cost as compared to the conventional superconducting material.

Moreover, when manufacturing a metal-based superconducting wire and an oxide superconducting wire, it is possible to manufacture a wire by the extruding and drawing used in general. Accordingly, this material is a quite attractive.

If a practical superconducting characteristic with an MgB$_2$-based wire can be maintained, it can be applied not only to a power transmission cable but to various fields including a bio-science spot lighted recently.

However, the MgB$_2$-based superconducting wire has a problem that the critical current density is low as compared with the conventional metal-based and the oxide-based superconducting wire. Moreover, a multi-core wire has also been examined but not yet reached at the practical critical current density.

In order to solve the aforementioned problems, various studies have been conducted: the MgB$_2$-based material is synthesized under a high pressure, the MgB$_2$-based material is made into a single phase, metal powder is added to the MgB$_2$-based material so as to improve junction between crystal grains, a pinning center is introduced, and the like. As a result, a short wire can cause a critical current density of the practical level. However, in the case where the actual application of the superconducting magnet is considered, it is necessary to obtain a high stability and high strength in addition to the critical current density. However, at the current stage, no MgB$_2$-based material has solved these technical problems.

SUMMARY OF THE INVENTION

It is therefore an object of the present invention to provide an MgB$_2$-based superconducting wire which can simultaneously realize the high critical current density, high stability, high strength, and lengthy shape, and its manufacturing method.

The inventors have studied primarily for an oxide superconducting wire and application of the magnet using the wire. During this study, the inventors have found that especially following four items are important to improve the critical current density:

(1) Selecting a metal sheath material which is not thermally reacted with a superconductor
(2) Filling density of a superconducting core when processed into the final form of product
(3) Improving the junction between grains
(4) Introducing a pinning center without moving the intruding magnetic flux line by trapping the quantized magnetic flux line.

By simultaneously realizing the aforementioned four items, it is possible to produce a superconducting wire having a high critical current characteristic. However, the critical current density is not a value inherent to a substance and greatly depends on the ratio of the superconductor in the wire, machining process, thermal condition and the like. For this reason, it has been found that the critical current density cannot be improved significantly by the method which has been applied to the oxide superconducting wire and the conventional metal-based superconducting wire. That is, it is necessary to find out optimal manufacturing steps according to the material, and a specific study is required for the $MgB_2$ superconductor.

Moreover, it is also important that the superconducting state is transferred to the ordinary conductive state (quench phenomenon) without burning the wire by using an electrically stable metal sheath. Furthermore, for example, when considering the use of a superconducting magnet in the magnetic field, an electromagnetic force obtained by a product of the magnetic field, critical current density and coil radius is applied to the wire. The wire itself should have a sufficient strength so that the wire is not deformed by the electromagnetic force, not deteriorating its performance.

The inventors tried to solve the aforementioned problems and have found a novel $MgB_2$ superconducting wire whose characteristic can be significantly improved as compared to the conventional superconducting wire and its manufacturing method.

That is, the aforementioned object can be achieved by an $MgB_2$ compound sheath superconducting wire structuring that a single-core wire or a multi-core wire coated by a metal having a specific electric resistance 7 $\mu\Omega$cm or below at room temperature is assembled into a base metal having Vickers hardness 50 or above at room temperature and having one or more holes.

Moreover, the object can be achieved by an $MgB_2$ compound sheath superconducting wire structuring that a single-core wire or a multi-core wire coated by a metal having Vickers hardness 50 or above at room temperature is assembled into a base metal having a specific electric resistance 7 $\mu\Omega$cm or below at room temperature and having one or more holes.

Here, in the case where a plurality of the single-core or multi-core wires are assembled into the base metal and they are twisted, this is quite effective for reducing the AC loss.

Moreover, the object can be achieved by an $MgB_2$ compound sheath superconducting wire structuring that an $MgB_2$ superconductor is assembled into a base metal having a specific electric resistance 7 $\mu\Omega$cm or below at room temperature and Vickers hardness 50 or above at room temperature. By manufacturing the wire with this method, it is possible to increase the ratio of superconducting core portion and improve the overall critical current density which is a practically important parameter.

In the aforementioned $MgB_2$ superconducting wire, more effect can be obtained if the density of the superconducting substance processed to the final form of product is 90% or above with respect to the theoretical density.

Moreover, the object can be achieved by a method for manufacturing an $MgB_2$ compound sheath superconducting wire, comprising the steps of: arranging a junction auxiliary material in an intermediate layer between the inner circumference of the hole arranged on the base metal and the outer circumference of a single-core or a multi-core wire, and performing thermal treatment to unify the base metal and the core wire.

Here, more effect can be obtained when the junction auxiliary material contains at least one selected from a group consisting of copper, silver, gold, palladium, aluminum, silicon, indium, tin, zinc, iron, lead, nickel, manganese and boron.

Moreover, it is possible to significantly reduce the production cost because no thermal treatment is applied to the superconducting wire during the superconducting wire manufacturing process.

Furthermore, it is possible to improve the critical current density of the filled powder by adding, 2 to 30 volume % with respect to $MgB_2$, copper, indium, tin, lead, iron, aluminum, magnesium, titanium, silicon oxide, silicon carbide or silicon nitride solely or in combination. A special effect can be obtained by reducing the grain size up to nanometer order.

Other objects, features and advantages of the invention will become apparent from the following description of the embodiments of the invention taken in conjunction with the accompanying drawings.

DETAILED DESCRIPTION OF THE EMBODIMENTS

The present invention uses a method of crushing compounds, mixing them and sintering the compound mixture as a manufacturing method of a superconducting powder, a sintered body and a clod. In this method, there is variation of mixing all the raw compounds at once and of mixing a part of raw compounds in advance and then mixing the remaining raw powder. As has been described above, it is effective to add three elements represented by 2 to 30 volume % of the metal powder.

The thermal treatment temperature of combining the superconducting powder in the present invention is a range from 200 to 1200 degrees C. Moreover, gases such as nitrogen gas, argon gas, hydrogen gas, oxygen gas and the like are used solely or in combination for the thermal treatment, as required. Furthermore, the thermal treatment may also be performed under a pressure above the atmosphere.

The experimental manufacturing process having been used primarily so far is a so-called powder-in tube method. That is, the aforementioned method is used to produce a superconducting powder or mixed powder which is then crushed into an appropriate size and sintered. The sintered powder is then filled in a pipe-shaped metal sheath material and processed with the drawing and rolling. The present invention is characterized by using a stable metal having a specific electric resistance 7 μΩcm or below at the room temperature and a high strength metal having a Vickers hardness 50 or above at the room temperature with those metals combined as a sheath material.

The stable metal having the specific electric resistance 7 μΩcm or below at the room temperature includes, for example, copper, aluminum, gold, silver, nickel, molybdenum, brass, niobium and the like.

Moreover, the high strength metal having the Vickers hardness 50 or above at the room temperature includes, for example, SUS304, SUS316, SUS310, SUS430, Hastelloy B, Hastelloy C, carbon steel, Inconel, cobalt, tungsten, nickel, molybdenum, titanium, Monel, aluminum-based alloy, titanium-based alloy, nickel-based alloy, copper-based alloy, niobium-based alloy, magnesium-based alloy and the like.

As described in an Example 4 later, the stable metal having the specific electric resistance 7 μΩcm or below at the room temperature and having the Vickers hardness 50 or above at the room temperature includes, for example, nickel, molybdenum, niobium copper, silver copper, bronze, chrome copper, zirconium copper, beryllium copper, aluminum copper oxide and the like. With use of these materials as sheath materials, there is a merit such that the compounded sheath is not required, thereby increasing the ratio of core portion.

In examples, the metal arranged outside the compounded sheath material is called a base metal, and one or more holes are opened on the base metal by the gun drill method or the metallurgic technique. The holes are preferably straight and the diameter of those should be constant in the longitudinal direction, but may be different diameters, as required. Thus, it is possible to improve the filling density of $MgB_2$.

The aforementioned materials can be considered to be used as a metal sheath material applicable to the present invention. It is, of cause, necessary not to react thermally with the superconductor and to have preferable workability in consideration of the mass production.

In the case of a combination with the compounded sheath, it is preferable to combine an electrically stable metal and a high strength metal (highly stable metal/high strength metal). Thus, it is possible to realize a wire which is electrically stable without quench and deterioration electromagnetic force.

Furthermore, in order to improve the workability, it is preferable to joint both the metals in advance. In this case, as has been described above, the inventors have clarified by an experiment that the simply contacted metals cannot bring about preferable workability because of the differences in hardness and ductility of the different metals. However, if the thermal treatment is applied to the manufacturing process, the junction or adhesion state of both the metals is slightly improved and the workability is improved, which has also been clarified by the experiment.

Moreover, it is quite effective to arrange a metal foil serving as a junction auxiliary material (brazing material) on a barrier surface between both metals. In this case, the foil thickness is normally 0.1 mm or below but not limited to a specific thickness. Thus, it is possible for the different metals to become unified metallurgically in a unified block, thereby significantly increasing the superconducting characteristic and workability.

The wire diameter is reduced by using such a draw bench, a swager, a cassette roller die or a groove roll. The wire drawing processing is then repeatedly performed by 1 to 20% of cross section area reduction per one pass. As is required, the wire is also processed into a multi-core wire. The wire processed with a round cross section or a hexagonal cross section is assembled into a pipe and drawn up to becoming a predetermined diameter by using the aforementioned device so as to be an 1 to 20% cross section area reduction per one pass, which is a generally processed method.

The process here makes the wire into a desired shape and increases the density of the superconducting powder filled in the metal sheath material. In order to further increase denseness, a cold or hot rolling mill is used to produce a flat angular or tape-shaped cross section. The thermal treatment may be performed under an appropriate temperature and atmosphere, as required, thereby producing a wire having high critical current density.

As is described in Lecture General Description of Cryogenic Engineering/Superconductor Society, 66th Spring Session (2002), the superconductor according to the present invention has an excellent bending characteristic and the critical current density is not deteriorated even when bending distortion of about 1% is applied. This excellent characteristic is remarkable as compared to the conventional metal-based superconducting wire and the oxide superconducting wire.

Furthermore, as has been described above repeatedly, the $MgB_2$ superconducting wire has a great characteristic that it can be used as a superconducting wire without performing the thermal treatment. This is because the junction or adhesion between crystal grains becomes preferable by the wire diameter reduction process and the deformation process, which has been confirmed with the experiment by the inventors. However, the thermal treatment is effective to improve junction between the crystal grains and can improve the critical current density by 2 to 20 times.

However, the average crystal grain diameter of the superconductor for preferably improving the critical current density is at least 50 μm or below and more preferably, 20 μm or below. If the average grain diameter exceeds this range, the critical current density is lowered, which has been confirmed by the experiment by the inventors.

The manufactured wire may be used in various ways for purposes. For example, one or more wires may be combined and wound into a coil shape or molded into a lead line state or a cable line state.

When performing the thermal treatment, in order to improve the characteristic of the superconductor, the thermal treatment atmosphere is selected according to the composition and additive metals. For example, the thermal treatment is performed by using nitrogen gas, argon gas, hydrogen gas, oxygen gas, solely or in combination of these at an appropriate flow rate or by enclosing the gas.

Moreover, in the $MgB_2$-based superconductor, magnesium having high vapor pressure may fly in all directions during the thermal treatment, causing composition displacement and deteriorating the superconducting characteristic. For this reason, for example, in the case of performing the thermal treatment, sintered magnesium substance is simultaneously heattreated so as to form a pseudo-magnesium atmosphere, which is more effective. Furthermore, in the case where magnesium is contained in the metal sheath material, the similar effect can be obtained.

Furthermore, improvement of junction or adhesion between crystal grains was attempted to considering the possibility of a proximity effect between the crystal grains with use of the large coherence length (ξ) of the $MgB_2$ superconductor.

As a result, we have clarified that the critical current density is significantly improved when the powder of indium, tin and lead, having a low melting point is added solely or in combination. The reason for improvement of the critical current density is considered that the superconductor or the metal powder added or a part of the both is melted during the diameter reduction process and deformation process, and thereby the junction or adhesion between crystal grains is improved.

Moreover, the inventors have confirmed by the experiment that the metal to be added has preferably a crystal diameter 20 μm or below. This is because the current path is cut off in the case where the added metal is larger than the superconducting layer in grain diameter, since the added metal is a non-superconducting layer.

Moreover, the amount to be added should not be too little or too great. The inventors have confirmed by the experiment that a 2 to 30 volume % is preferable with respect to the ratio of superconductor volume. When the added metal is dispersed to the superconductor crystal grain boundary and in the grains, the pinning force can be increased.

In the manufacturing process of the wire in the present invention, when performing the final process to produce the final form of superconducting wire, it is necessary to apply a process of forming the cross section area reduction of 5% or above and more preferably 10% or above. The drawing or rolling process for reducing the cross section area, as described above, has a function to increase the density of the superconductor filled in the metal sheath material. Furthermore, the same effect can be obtained by applying a pressure of 1 ton/cm$^2$ or above to the superconducting wire so as to be deformed.

Moreover, by employing the concept of the present invention, in addition to the aforementioned method, it is also possible to obtain the equivalent superconducting characteristic by using the wire prepared by the thermal spraying method, doctor blade method, dip coat method, spray pyrolysis method or jelly roll method.

Moreover, the superconducting wire of the present invention has a high mechanical strength such as yielding stress, tensile strength, Young's modulus and the like, and can constitute a magnet which can proof the electromagnetic force when an intense magnetic field occurs. By making both end resistances sufficiently small, it is possible to realize a permanently current flown magnet.

Moreover, when using the superconductor produced by the present invention in a liquid helium, a practical superconductor can be realized, such as a superconducting magnet generating a more intense magnetic field, by combining with the metal-based superconductor and the oxide superconductor.

The metal-based superconductor here may be used NbTi-based alloy, $Nb_3Sn$-based compound, $Nb_3Al$-based compound, $V_3Ga$-based and Chevrel-based compound and the like. Two or more types of magnet are arranged, as required. The oxide superconductor is hereby preferably a superconductor of Y-based, Bi-based, Tl-based, Hg-based or Ag—Pb-based.

Moreover, in the case of using the superconductor produced by the present invention in liquid hydrogen or liquid neon, a practical superconductor of high performance superconducting magnet by combining with the oxide superconductor.

The aforementioned superconducting wire can be used for, in addition to, a power transmission cable, a current lead, an MRI device, an NMR device, an SMES device, a superconducting generator, a superconducting motor, a magnetic levitation train, a superconducting electromagnetic propulsive ship, a superconducting transformer, a superconducting current-limiting device, other than the superconducting magnet.

Moreover, the superconducting wire formed into a desirable shaped conductor is assembled as conductors such as a coil, a current lead and a cable after a deformation process. Moreover, when the operating temperature is equal to or higher than the liquid hydrogen temperature or liquid neon temperature, more effect can be obtained. Hereinafter, examples of the present invention will be explained in detail.

EXAMPLE 1

A surface of copper pipe having an outer diameter 15 mm, an inner diameter 13 mm and a length 1000 mm is wound with a brass foil having a thickness 0.05 mm, which is assembled into a SUS316 pipe having an outer diameter 18 mm, an inner diameter 15.5 mm and a length 1100 mm.

The assembled pipe is processed with the drawing/clasping process so that the outer diameter becomes 17 mm and then applied to the thermal treatment under 800 to 1000 degrees C. in a reduction atmosphere so as to be formed into a unitary block, thereby producing a copper/SUS316 compound pipe. It should be noted that the copper is of a specific electric resistance of about 1.6 μΩcm at the room temperature and the SUS 316 is of a Vickers hardness of about 145 at the room temperature. Moreover, the brass is used in this invention as a junction auxiliary material.

Next, a filling powder is prepared. Magnesium powder (Mg purity: 99%) and amorphous boron powder (B purity: 99%) are used as starting raw materials. The magnesium and boron are then check-weighed to be 1:2 at atomic moll ratio and mixed for 10 to 60 minutes. Next, this mixture is applied by the thermal treatment in an argon atmosphere at 700 to 1400 degrees C. for 2 to 20 hours to produce an $MgB_2$ superconductor. Here, the thermal treatment may be performed by applying a pressure above the atmospheric pressure. Moreover, the atmosphere of the thermal treatment is not limited to the argon but may be hydrogen atmosphere, nitrogen atmosphere or mixture of them.

With the produced powder checked by the X-ray diffraction analysis, it has been found that $MgB_2$ superconductor contains 95% or above by calculation of the strength ratio. In addition to the $MgB_2$ superconductor, non-superconductor layers of some MgO and $MgB_4$ have also contained. Indium metal powder having an average grain diameter 20 μm or below was added solely by 15 volume % to the $MgB_2$ superconducting powder and they are mixed for 10 to 60 minutes to produce a mixed powder.

The produced mixed powder is filled in the copper/SUS316 compound pipe. In the case of performing the filling, the powder can be filled into the pipe as it is or a cylindrical or angular rod formed by pressing the powder may also be filled into the pipe. The compound pipe is then processed repetitively with the drawing process to become a cross sectional area reduction ratio of 3 to 20% per one pass, thereby obtaining a predetermined shape and diameter. The wire cross sectional shape may also be formed, as reduction of the cross sectional area, to an elliptical shape, a polygon such as a rectangular and hexagonal shape, a flat angular shape, a tape shape and a round shape, as required. In this example, eventually, the superconducting wire 1 having an outer diameter 1.0 mm, a thickness 0.4 mm and a width 2.5 mm is produced.

Figure 1A:
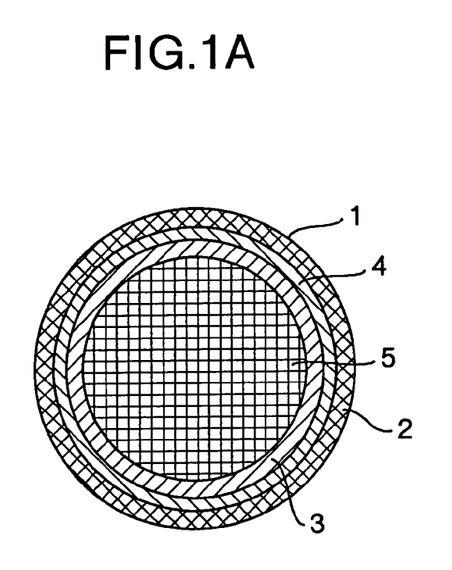
FIGS. 1A and 1B are schematic cross sectional views of a compound sheath single core wire in Example 1.
Figure 1B:
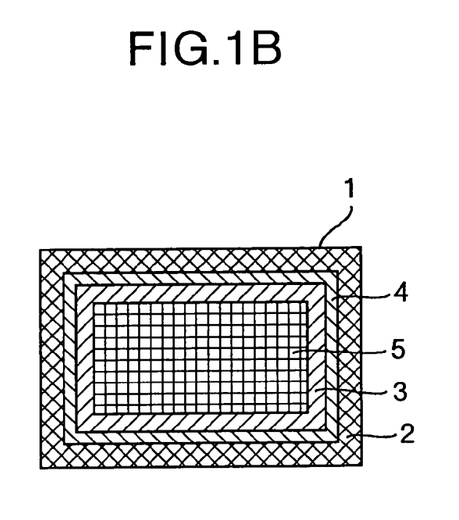

FIGS. 1A and 1B show examples of cross sectional view of the produced superconducting wire 1. The superconducting wire 1 is a compound sheath superconducting wire composed of a metal 2 having the Vickers hardness 50 or above and a metal 3 having the specific electric resistance 7 μΩcm or below, at the room temperature. Moreover, at the interface between the metal 2 having the Vickers hardness 50 or above and the metal 3 having the specific electric resistance 7 μΩcm or below, at the room temperature, a junction auxiliary material 4 is arranged so as to electrically and mechanically unify or integrate the different metals into a unitary block. The $MgB_2$ superconductor 5 is filled or contained in the metal 3 having the specific electric resistance 7 μΩcm or below.

Figure 2:
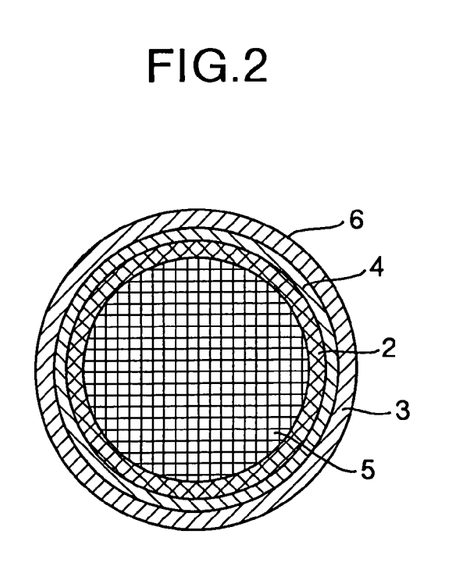
FIG. 2 is another schematic cross sectional view of a compound sheath single core wire in Example 1.

Moreover, the cross sectional configuration of the compound sheath wire is composed of copper at the inner circumference and SUS 316 at the outer circumference but as the superconducting wire 6 shown in FIG. 2, the SUS316/copper compound sheath wire may be composed by arranging the SUS316 at the inner circumference and the copper at the outer circumference. In also this case, the aforementioned manufacturing method can be applied and it is possible to use the same junction auxiliary material. In this example, it is possible to obtain a wire having a length exceeding 30 m in both cases.

Figure 3:
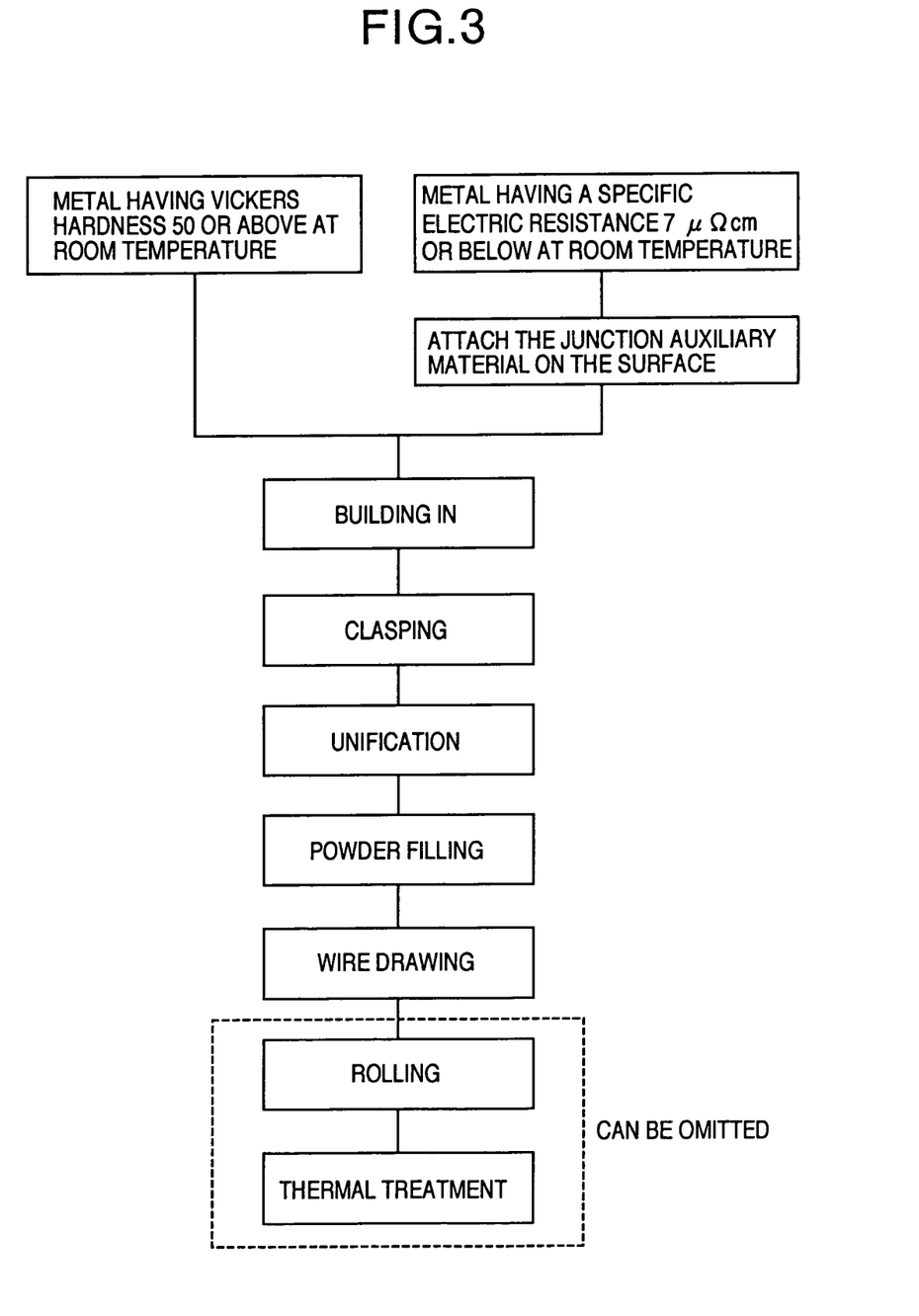
FIG. 3 is a flowchart showing an example of manufacturing steps of the compound sheath single core wire in Example 1.

FIG. 3 shows an example of manufacturing process of the copper/SUS316 compound sheath $MgB_2$ single-core wire manufactured in this example. The powder filling step is preferably performed after integrating the metal pipe into the unitary block but it is also possible to perform is before the integration.

The critical temperatures of the superconducting wire 1 having a thickness 0.4 mm and a width 2.5 mm and the superconducting wire 6 were measured by using the DC 4-terminal method and it has been found that the both of them cause the superconducting state at 38 K.

Next, the critical current density of each wire is measured at temperature 4.2 K and in the magnetic field 0.5 T. As a result, it is possible to obtain 2800 A/mm$^2$ by the superconducting wire 1 and 2950 A/mm$^2$ by the superconducting wire 6.

Next, a comparative material has been prepared in the same way as the copper/SUS316 compound sheath single-core wire manufacturing procedure of FIG. 3, except for that the step of winding the brass foil as junction auxiliary material on the copper pipe surface is omitted.

That is, when assembling the different metals, the cross sectional configuration is such that the copper at the inner circumference is attached to the SUS316 only by contact or adhesion. As a result of performing the wire drawing process with the cross sectional area reduction ratio of 3 to 20%, breaking of the wire often occurs when the processing degree exceeds 75%. This is appreciated because the extension and hardness differ in the different metals. Moreover, as a result of measuring the critical current density of the broken wire, it is also appreciated that a constant voltage is generated with increase of current.

In order to examine the reason, the cross section is observed by using an optical microscope. It has been found that the junction between different metals is insufficient and a gap is generated. The contact resistance of that portion is therefore the reason.

As has been described above, it has been clarified that arrangement of the junction auxiliary material between the different metals is quite effective to improve the workability and superconducting characteristic.

EXAMPLE 2

A through-hole is made at the center of an SUS316 pipe having an outer diameter 18 mm and a length 500 mm, and six through-hole are also made around the center. The through-holes are made by using the gun drill method and the hole diameter is 2.5 mm.

Figure 4:
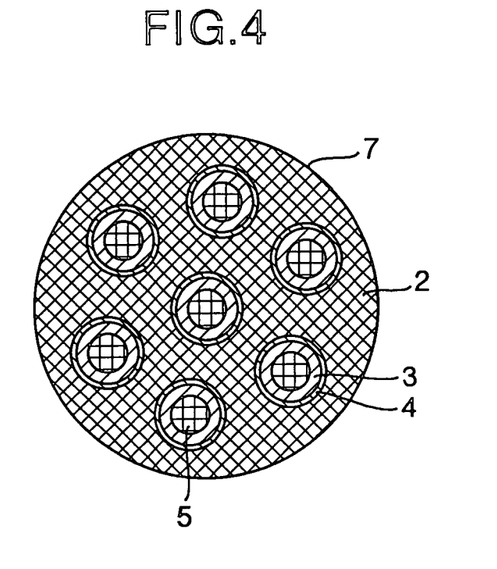
FIG. 4 is a schematic cross sectional view of a compound sheath multi-core wire in Example 2.

Next, powder produced in the same way as Example 1 is filled in an aluminum pipe having an outer diameter 15 mm, an inner diameter 13 mm and a length 400 mm. An aluminum sheath wire applied by the drawing process up to becoming 2.35 mm in diameter is assembled into the aluminum pipe to obtain the cross section as shown in FIG. 4. When assembling, the aluminum sheath wire was wound by a brass foil having a thickness of 0.05 mm to serve as a junction auxiliary material.

After applying the drawing/clasping process to becoming an outer diameter 17 mm and integrating different metals into a unitary block by applying the thermal treatment of 800 to 1100 degrees C. in a reduction atmosphere, thereby a 7-core structured aluminum/SUS316 compound sheath wire is produced. It should be noted that the aluminum is of a specific electric resistance of about 2.5 μΩcm at the room temperature and the SUS316 is of the Vickers hardness of about 145 at the room temperature.

In addition to this method, it is also possible to insert aluminum pipes wound by the brass foil, before filled with the powder, into the seven through-holes made by the gun drill method on the SUS316 pipe, and after combining or integrating those into a unitary block, the $MgB_2$ powder is filled in the pipes. In this case, it is not necessary to consider the thermal reaction between the sheath material and the superconductor, so that it is possible to increase the selection range of the junction thermal treatment condition for the unitary block, for combining such as temperature, atmosphere and time.

By performing the same treatment as in Example 1, in this embodiment, finally, a superconducting wire 7 having a thickness 1 mm and width 2 mm is produced. In this embodiment, the 7-core structure is produced in this Example it is also possible to produce a 19-core, 37-core, and 61-core, as required.

FIG. 4 shows an example of cross sectional view of the superconducting wire 7 produced. The superconducting wire 7 is a compound sheath multi-core superconducting wire composed of a metal 2 having the Vickers hardness 50 or above and a metal 3 having the specific electric resistance 7 μΩcm or below, at the room temperature. Moreover, at a boundary surface between the metal 2 having the Vickers hardness 50 or above and the metal 3 having the specific electric resistance 7 μΩcm or below at the room temperature, a junction auxiliary material 4 is arranged so as to electrically unify or integrate the different metals into the unitary block. The $MgB_2$ superconductor 5 is filled or contained in the metal 3 having the specific electric resistance 7 μΩcm or below.

Figure 5:
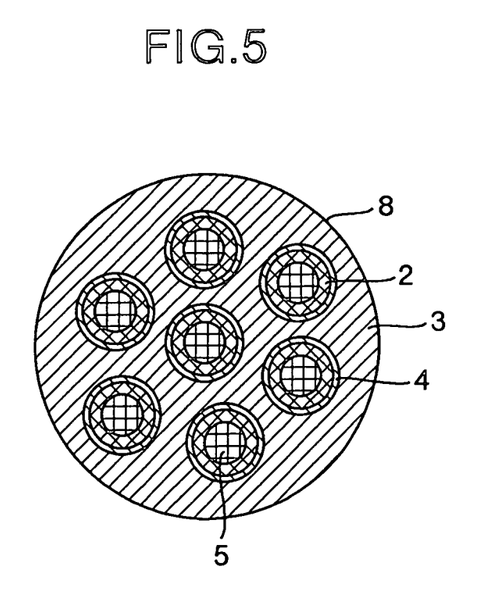
FIG. 5 is another schematic cross sectional view of a compound sheath multi-core wire in Example 2.

Moreover, here, the cross sectional configuration of the compound sheath wire is composed of aluminum at the inner circumference and SUS 316 at the outer circumference but as the superconducting wire 8 shown in FIG. 5, the SUS316/aluminum compound sheath multi-core wire may be composed by arranging the SUS316 at the inner circumference and the aluminum at the outer circumference. In also this case, the aforementioned manufacturing method may be applied and it is possible to use the same junction auxiliary material.

Figure 6:
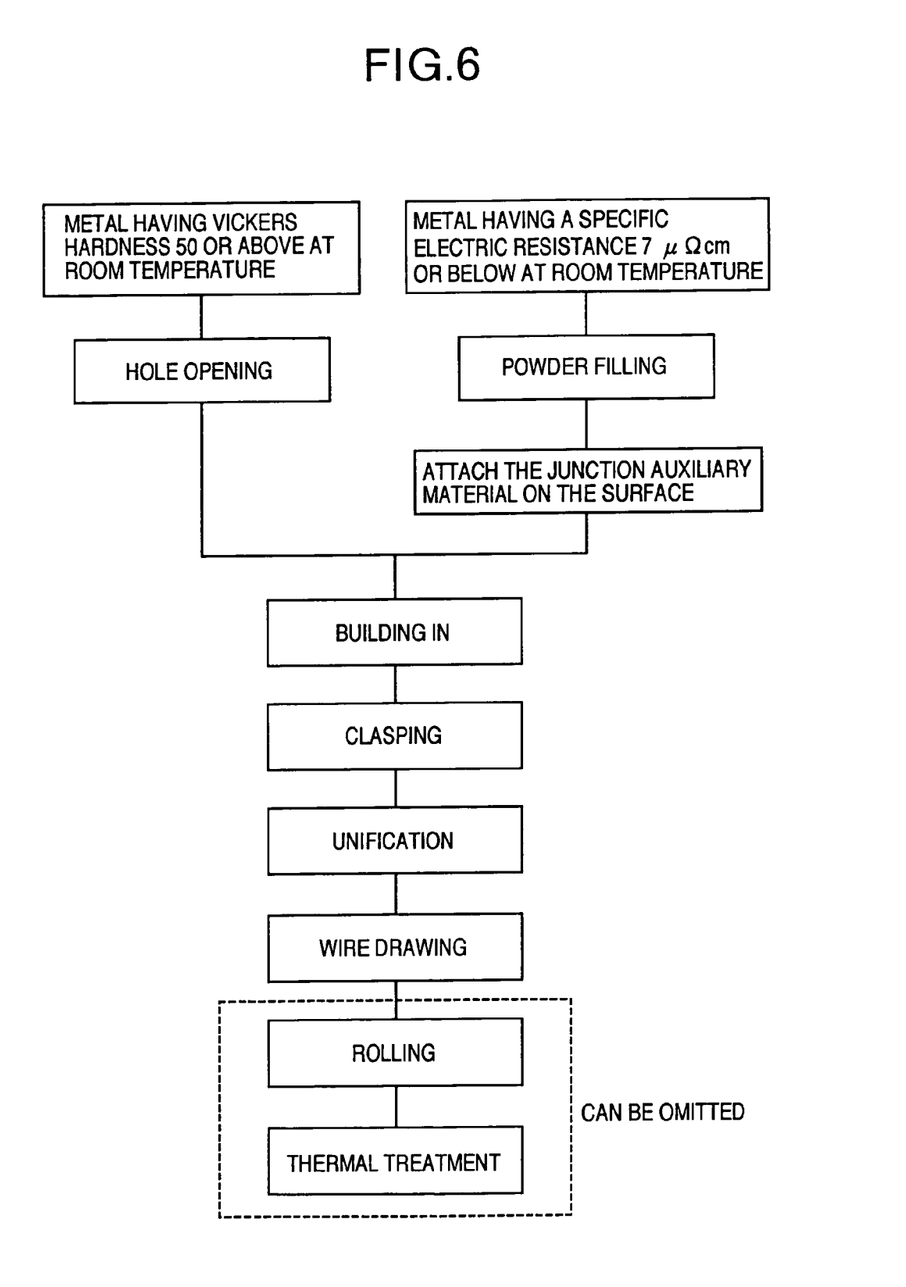
FIG. 6 is a flowchart showing an example of manufacturing steps of the compound sheath multi-core wire in Example 2.

In this Example, a wire having a length exceeding 30 m in both cases is produced without breakage. FIG. 6 shows an example of manufacturing steps of the aluminum/SUS316 compound sheath $MgB_2$ multi-core wire manufactured in this Example.

The critical temperatures of the superconducting wire 7 and the superconducting wire 8 having thickness 1 mm and width 2 mm are measured by using the DC 4-terminal method and it is found that the both of them cause the superconducting state at 37.5 K.

Next, the critical current density of each wire is measured at temperature 4.2 K and in the magnetic field 0.5 T, obtaining 2900 $A/mm^2$ for the superconducting wire 7 and 2850 $A/mm^2$ for the superconducting wire 8.

Figure 7:
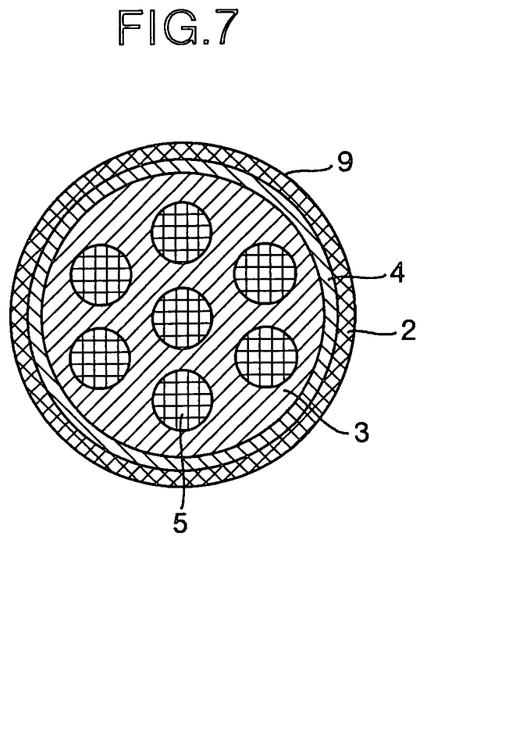
FIG. 7 is still another schematic cross sectional view of a compound sheath multi-core wire in Example 2.
Figure 8:
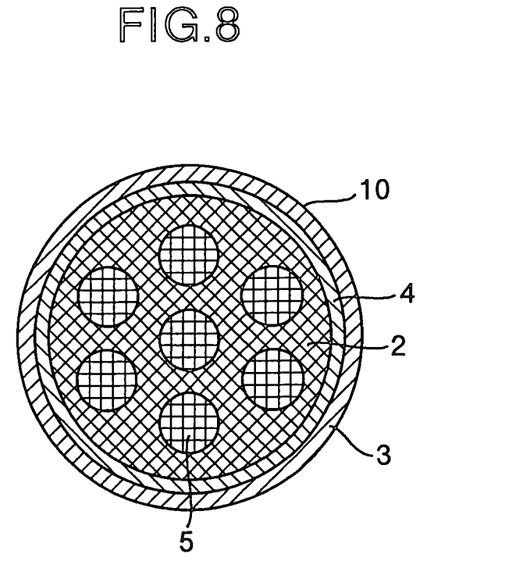
FIG. 8 is a schematic cross sectional view of a compound sheath multi-core wire according to the present invention.

Moreover, by further experiments, in the case where the superconducting wire 9 and the superconducting wire 10 are formed of the cross sectional structure as shown in FIG. 7 and FIG. 8, the same superconducting characteristic can be obtained, as described above.

In the case of the cross sectional structure of the superconducting wire 9 and the superconducting wire 10, the sintering auxiliary material may be arranged only at a single place, which brings about a merit that the wire manufacturing becomes comparatively easy.

Next, as shown in FIG. 6, a comparative material is prepared in the same way as the aluminum/SUS316 compound sheath multi-core wire by manufacturing steps, except that the step for winding the brass foil, as junction auxiliary material, on the aluminum pipe surface is omitted.

That is, when assembling the different metals, the cross sectional structure indicates that the aluminum at the inner circumference is only contacted closely with the SUS316 at the outer circumference. Wire drawing process is then performed with the cross sectional area reduction ratio becoming 3 to 20%, as a result, in the same way as Example 1, breaking of the wire often occurs when the processing degree exceeds 75%.

This is because it is clarified that the extension and hardness differ in the different metals. Moreover, the critical current density of the broken wire is thereafter measured, as a result of this measurement, it is found that a constant voltage is generated with increase of the current. In order to examine the cause of generation, the cross section is observed by using an optical microscope. It is found that a gap is occurred since the junction between different metals is insufficient, confirming a contact resistance occurred at the gap.

As has been described above, it has been clarified that arrangement of the junction auxiliary material between the different metals is quite effective to improve the workability and superconducting characteristic.

EXAMPLE 3

A through-hole is made at the center of an SUS316 pipe having an outer diameter 24 mm and a length 300 mm and at six positions around the center. The through-holes are made by using the gun drill method and the hole diameter is all 5 mm. Moreover, powder produced in the same way as Example 1 is filled in a copper pipe having an outer diameter 8 mm, an inner diameter 6 mm and a length 1000 mm. This copper pipe is processed with the wire drawing to be extended up to an outer diameter 0.65 mm by using a draw bench.

Next, seven of the manufactured copper sheath wires are twisted and stranded into one set with a 30 mm twisted pitch, which forms a seven-stranded wire. Each of the seven stranded wires is wound with a brass foil having a thickness of 0.01 mm to serve as a junction auxiliary material and assembled into the seven through-holes. When inserting the wires into the through-holes, a gap occurs, but normally, different metals can be processed into a unitary block by the unitary processing. But, in order to improve the yield, it is effective to insert a junction auxiliary material into the gap.

Then, a lengthy product containing the seven stranded wires is applied by the wire drawing/clasping process to become 22.7 mm in diameter, also applied by the thermal treatment under 800 to 1100 degrees C. in a reduction atmosphere so that different metals are made into a unitary block, thereby producing a 49-core structured copper/SUS316 compound sheath wire. After this, the processing identical to Example 1 and Example 2 is performed and finally a superconducting wire 9 having an outer diameter 1.2 mm is produced. In this Example, the number of cores is 49, but it may be modified as is required.

Figure 9:
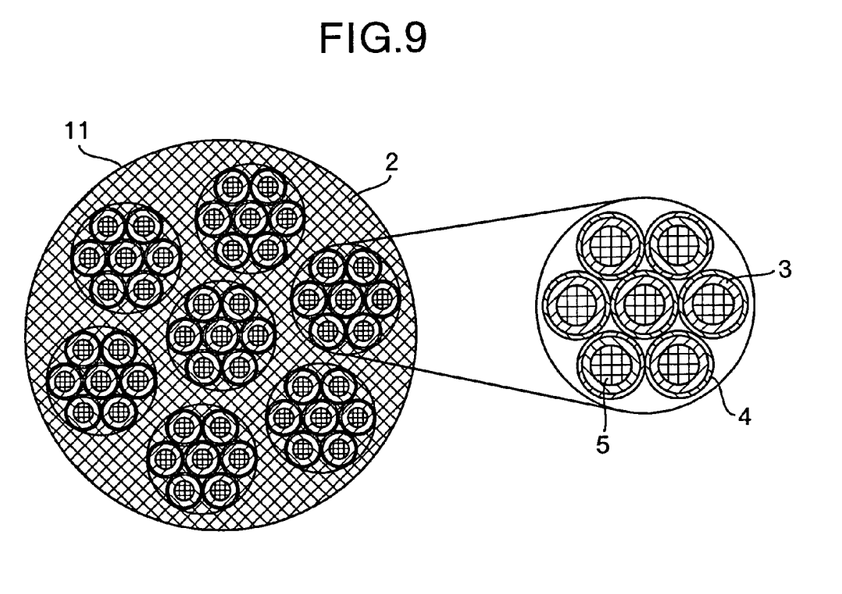
FIG. 9 is a schematic cross sectional view of a twisted compound sheath multi-core wire in Example 3.

FIG. 9 shows an example of a cross sectional view of a superconducting wire 11. The superconducting wire 11 is a compound sheath multi-core superconducting wire composed of a metal 2 having the Vickers hardness 50 or above and a metal 3 having the specific electric resistance of 7 $\mu\Omega cm$ or below, at room temperature. Among these metals, the metal 3 having the specific electric resistance of 7 $\mu\Omega cm$ or below at room temperature is used as a 7-stranded wire which is twisted. Moreover, at the boundary surface between the high-strength metal 2 having the Vickers hardness 50 or above and the metal 3 having the specific electric resistance of 7 $\mu\Omega cm$ or below, at room temperature, the junction auxiliary material is arranged so that different metals are made into an electrically unitary block. The $MgB_2$ superconductor 5 is also filled or contained in the metal 3 having the specific electric resistance of 7 $\mu\Omega cm$ or below.

Figure 10:
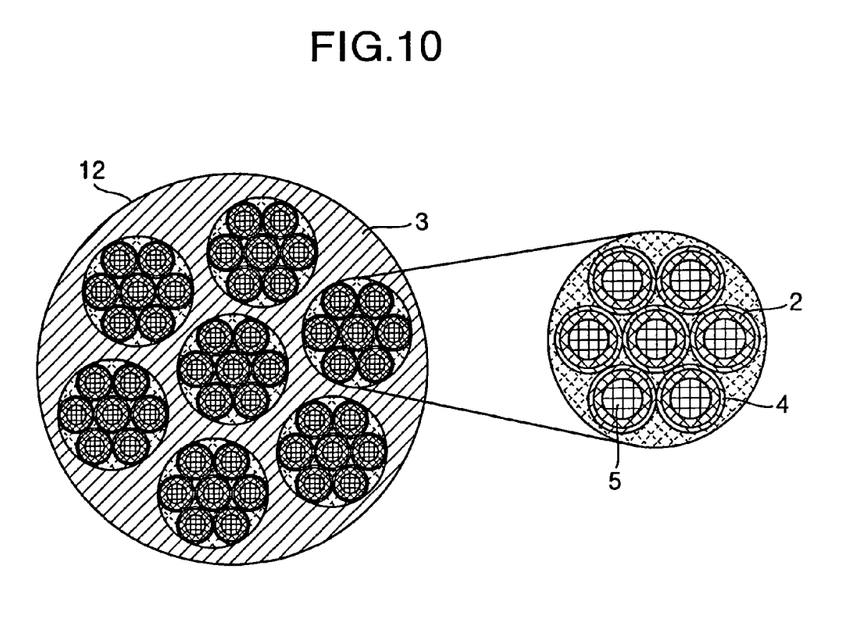
FIG. 10 is a schematic cross sectional view of a twisted compound sheath multi-core wire according to the present invention.

Moreover, the copper is arranged in the inner circumference and SUS316 is arranged at the outer circumference, as the cross sectional configuration of the compound sheath wire. However, as the superconducting material 12 shown in FIG. 10, it is also possible to produce an SUS316/copper compound sheath multi-core wire by arranging the SUS316 at the inner circumference and the copper at the outer circumference. In also this case, the aforementioned twist processing and wire drawing processing can be applied and the same junction auxiliary material can be used.

Figure 11:
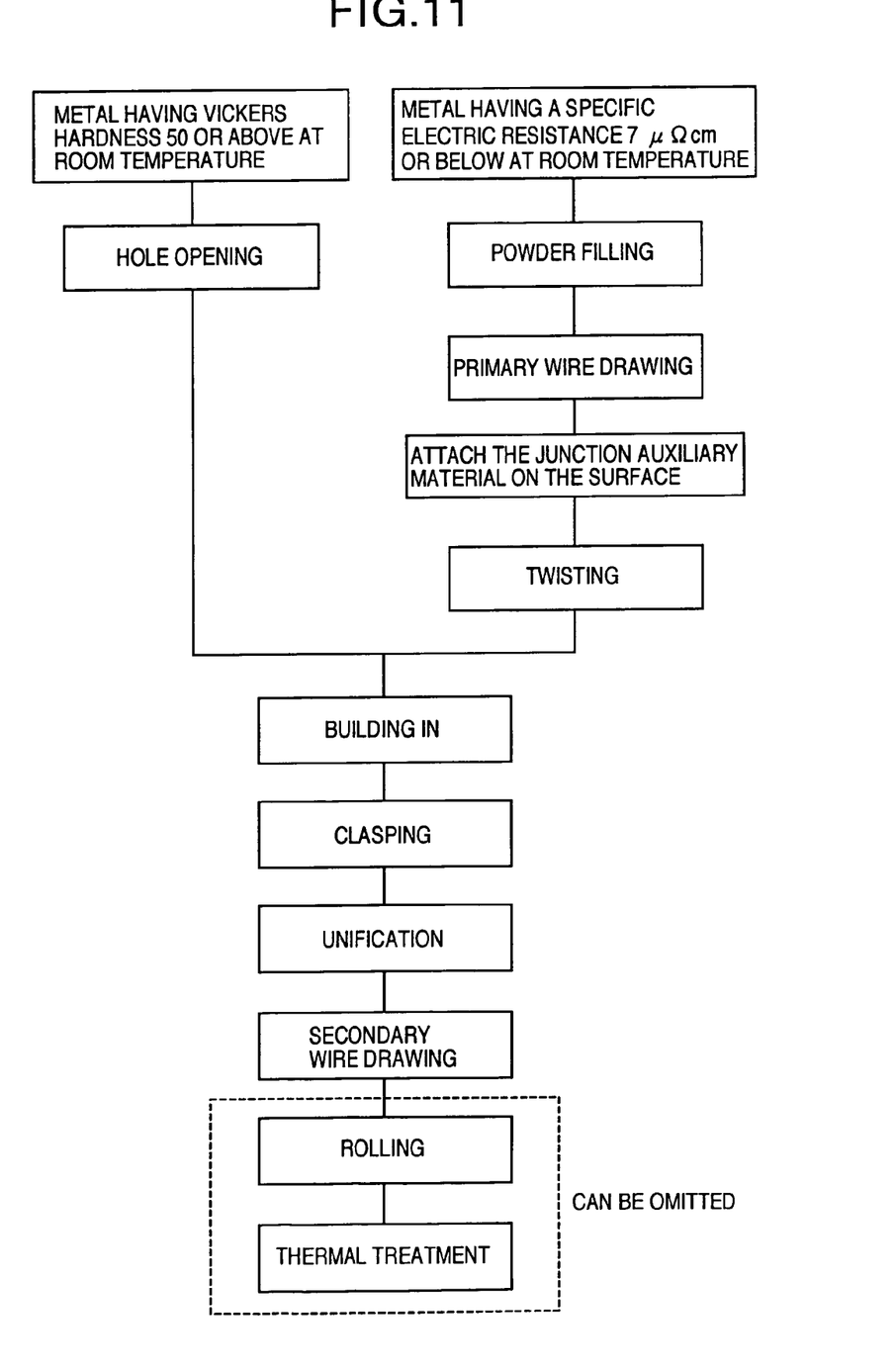
FIG. 11 is a flowchart showing an example of manufacturing steps of the twisted compound sheath multi-core wire in Example 3.

In this Example, in the case of both the wires having the copper on the inner circumference and SUS316 on the outer circumference and vice versa, the wire having a length exceeding 30 m without breakage is practically produced. FIG. 11 shows an example of manufacturing steps of the copper/SUS316 compound sheath $MgB_2$ multi-core wire.

The critical temperatures of the superconducting wire 11 and the superconducting wire 12 having an outer diameter 1.2 mm are measured by using the DC 4-terminal method. It is hereby found that the both wires cause the superconducting state at 37.5 K.

Next, the critical current density of each wire is measured at temperature 4.2 K and in the magnetic field 0.5 T. As a result of the measurement, the critical current density indicates 2600 $A/mm^2$ for the superconducting wire 11 and 2500 $A/mm^2$ for the superconducting wire 12.

Next, the AC loss of the twisted superconducting wire 9 and the superconducting wire 10 is measured in the magnetic field. For a purpose of comparison, a non-twisted copper/SUS316 compound sheath wire 13 is also measured. At this measurement, the applied magnetic field is 0.005 to 0.5 T and the frequency is 50 Hz.

Figure 12:
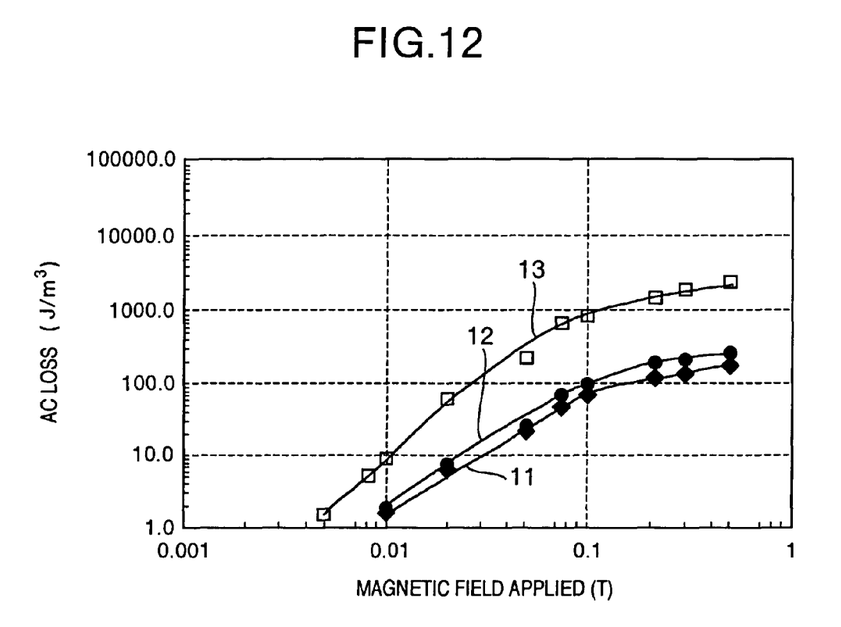
FIG. 12 is a graph showing the relationship between the applied magnetic field of the wire manufactured by the present invention and the AC loss.

FIG. 12 shows the graph of the measurement results. As is clear from FIG. 12, it is found that the twisted superconducting wire 11 and the superconducting wire 12 can reduce the AC loss to about 1/10 as compared to the non-twisted superconducting wire 13.

As has been described above, in the case of the AC application, it is clarified that the total AC loss is significantly reduced by using a superconducting wire twisted in the longitudinal direction of the wire in the cross sectional core.

EXAMPLE 4

In the case where the metal specifies the specific electric resistance 7 μΩcm or below and Vickers hardness 50 or above at the room temperature, a silver-based silver-copper alloy rod and a nickel rod having an outer diameter 18 mm and length 300 mm are produced. A through-hole is made at the center of the pipes and six holes are made to surround the center hole. The through-holes are made by using the gun drill method and the hole diameter is 3.5 mm.

Next, an $MgB_2$ bulk material having an outer diameter 3.45 mm, a length 250 mm and a density 2.0 g/cm$^3$ is filled in each hole of the silver-copper alloy pipe and the nickel pipe, and the pipes are processed with the wire drawing processing up to finally becoming 1.2 mm in diameter by using the draw bench, producing a superconducting wire 14.

Figure 13:
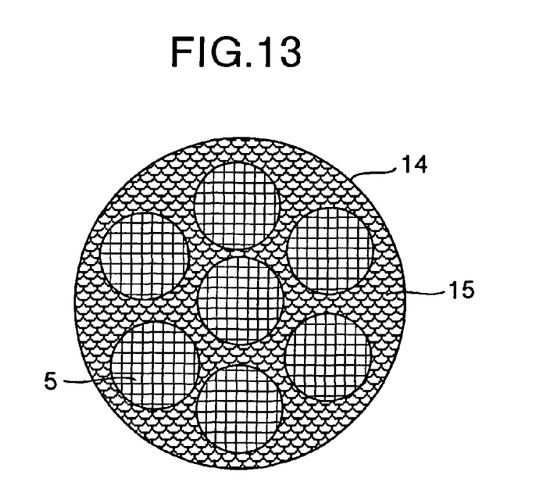
FIG. 13 is a schematic cross sectional view of a compound sheath multi-core wire in Example 4.

FIG. 13 shows an example of a cross sectional view of the superconducting wire 14. The superconducting wire 14 is a multi-core wire composed of a metal 15 having the Vickers hardness 50 or above and the specific electric resistance of 7 μΩcm or below, at the room temperature, and a $MgB_2$ superconductor 5 is filled or contained in the multi-core wire. Since this wire can assemble with the superconductor itself instead of assembling with the sheath wire, there is a merit that the ratio of core portion can be increased.

Figure 14:
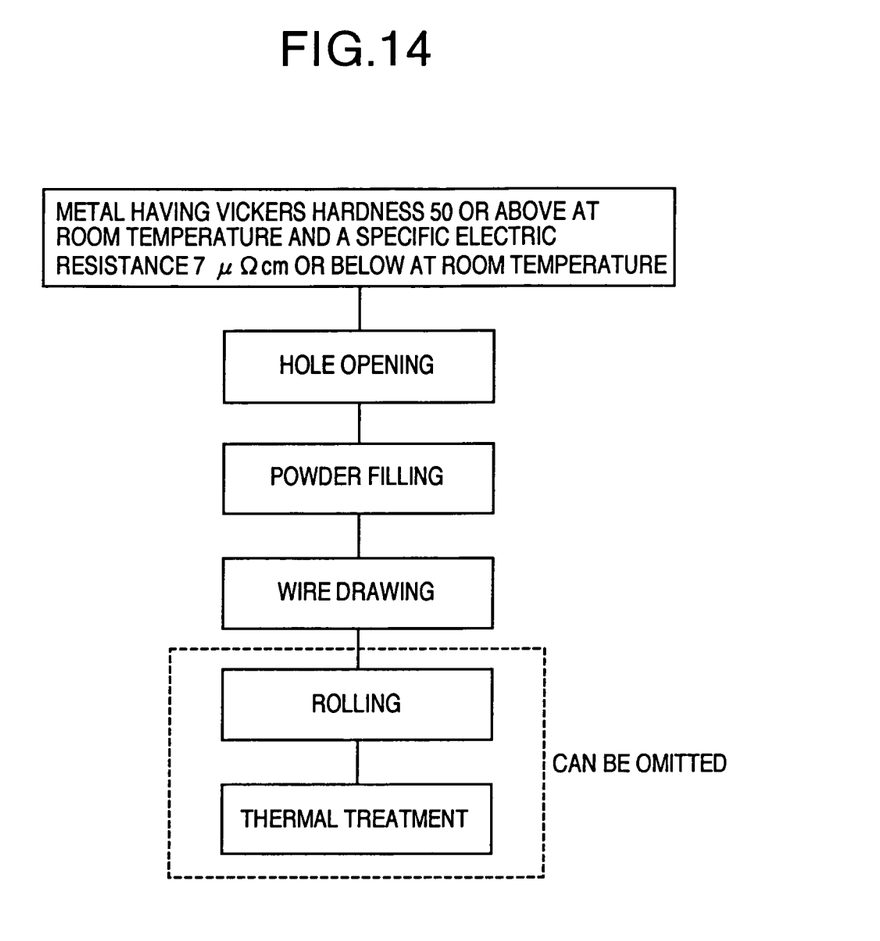
FIG. 14 is a flowchart showing an example of manufacturing steps of the compound sheath multi-core wire in Example 4.

In this Example, a wire exceeding the length of 30 m is produced without breakage for both the wires without assembling the sheath wire and the wire assembling with the superconductor itself. FIG. 14 shows an example of manufacturing steps of the $MgB_2$ multi-core wire produced in this Example.

The critical temperatures of the superconducting wire 14 having an outer diameter 1.2 mm produced in this Example is measured by using the DC 4-terminal method. It is hereby found that the both of the silver-copper alloy sheath wire and the nickel sheath wire cause the superconducting state at 37 K.

Next, the critical current density of each produced wire is measured at temperature 4.2 K and in the magnetic field 0.5 T. As a result, the critical current density indicates 2450 A/mm$^2$ for the silver-copper alloy sheath wire and 2500 A/mm$^2$ for the nickel sheath wire. This is practically important that the superconducting core ratio is increased. The overall Jc is also obtained 1000 A/mm$^2$ or above. Moreover, the critical current density of each wire is also measured at temperature 4.2 K and in the magnetic field 5 T, obtaining 600 A/mm$^2$ for the silver-copper alloy sheath wire and 500 A/mm$^2$ for the nickel sheath wire.

Next, for a purpose of comparison, a gold sheath $MgB_2$ multi-core wire is produced by the manufacturing steps shown in FIG. 14 with use of a gold sheath material which does not satisfy simultaneously the conditions of the specific electric resistance 7 μΩcm or below and Vickers hardness 50 or above, at the room temperature.

As a result, the wire is produced without breakage but the critical current density at the temperature 4.2 K and the magnetic field 0.5 T is only 1750 A/mm$^2$ which is about 70% in comparison with those of the silver-copper alloy sheath material and the nickel sheath wire. Moreover, in the temperature 4.2 K and the magnetic field 5 T, the critical current density is deteriorated down to 10 A/mm$^2$.

It is confirmed that the superconducting characteristic is lowered because the sheath material strength is insufficient and the superconducting core portion denseness and the mechanical strength of the wire itself are insufficient.

As has been described above, it is clarified that a wire having a practical wire performance is produced by using the metal sheath material having the specific electric resistance 7 μΩcm or below and the Vickers hardness 50 or above, at the room temperature.

EXAMPLE 5

In the 7-core aluminum/SUS sheath superconducting wire 7 produced in Example 2, the 5 relationship between the density and the critical current density of the superconducting substance is studied. A result of study is shown in Table 1.

TABLE 1

| Superconducting material density (%) | 55 | 65 | 75 | 85 | 90 | 93 | 95 | 98 |
|---|---|---|---|---|---|---|---|---|
| Critical current density ($\times 10^2$ A/mm$^2$) | 0.2 | 0.8 | 1.5 | 5.5 | 20.8 | 24.4 | 26.5 | 27.4 |

The superconducting material density is a value with respect to a theoretical density and expressed in percentage. It should be noted that the density is obtained by adjusting the processing degree of the wire. Moreover, in this example, the density of powder filling is set to 50% of the theoretical density. The critical current density is measured in the temperature 4.2 K and magnetic field 0.5 T.

As has been described above, it has been clarified that the critical current density is significantly improved when the density of the superconducting substance contained in the superconducting wire exceeds 90%.

Moreover, further detailed experiments, it is confirmed that the critical current density is significantly improved when the density of the superconducting substance contained in the superconducting wire exceeds 90% with respect to the theoretical density even if differing the powder production condition, the condition of adding the third element to the powder, the wire processing condition, the thermal processing condition and the like.

After this, the cross section of each wire is observed by using a scanning electron microscope, as a result, it is found that the denseness of the superconducting core portion is improved and the junction between the crystal grains is also improved when the density of the superconducting substance exceeds 90%. This is considered to be the primary factor that the critical current density is improved.

EXAMPLE 6

A copper/SUS316 compound sheath $MgB_2$ single-core wire is produced in the same way as the superconducting wire 1 in Example 1, except that the brass foil as used the junction auxiliary material is replaced by the following six junction auxiliary materials.

In this example, the following six junction help materials are used:

(1) Copper braze containing copper as a primary content
(2) Silver braze containing silver as a primary content (3) Gold braze containing gold and copper as primary contents
(4) Palladium braze containing palladium and silver as primary contents
(5) Aluminum braze containing aluminum and silicon as primary contents
(6) Copper/manganese braze containing copper and manganese as primary contents At least one element selected from the group consisting of indium, tin, zinc, iron, lead, nickel, manganese, and boron may be added to them.

Junction between the different metals of the copper/SUS316 into a unitary block is performed under the temperature of 580 to 1200 degrees C. The junction between the different metals is obtained by any of the junction auxiliary material without any problem and like the case of Example 1 using the brass foil, producing a wire exceeding 30 m without breakage.

It is found that the critical temperature of each wire indicated the superconducting state at 37 to 38 K. Moreover, the critical current density at temperature 4.2 K and in the magnetic field 0.5 T indicates 2300 to 2800 A/mm$^2$, confirming that the superconducting characteristic is not deteriorated.

If necessary, the aforementioned superconducting wires can increase their strength by impregnation in epoxy resin and hardening. The epoxy resin may be selected according to the purpose such as silicon-based resin and urethane-based resin.

The wire according to the present invention can be widely applied to superconducting devices such as a large-size magnet, a nuclear magnetic resonance analysis device, a medical MRI device, a superconducting power storage device, a magnetic separation device, a device for pulling up monocrystal in magnetic field, a refrigerator cooling superconducting magnet device, a magnetically floating train, and the like and it is possible to obtain a high efficiency of the devices.

According to the present invention, it is possible to simultaneously obtain a high stability and high strength and obtain a superconducting wire having a practical critical current density.

Moreover, the superconducting wire and the superconducting magnet can be operated by being cooled not only by liquid helium but also liquid hydrogen, liquid neon, refrigerator conduction cooling, and the like and can have a high superconducting critical current density even in the magnetic field.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A compound sheath superconducting wire comprising:
a metal base wire member with a Vickers hardness of at least 50 at room temperature, wherein the metal base wire member includes iron,
a plurality of tubular-shaped metal cladding layers having a superconductor material coaxially provided within the tubular-shaped metal cladding layers, wherein each of the metal cladding layers has an electric resistance of 7μΩcm or less at room temperature, each of the tubular shaped metal cladding layers being arranged to be provided within the metal base wire member in parallel with each other along a longitudinal direction of the metal base wire member prior to a drawing step to form the compound sheath superconducting wire, and
an intermediate layer coaxially provided outside the tubular-shaped metal cladding layers, wherein the intermediate layer is electrically and mechanically unified metallurgically with the metal base member and the tubular-shaped metal cladding layers in a unitary block such that a gap is not formed between the metal base wire member and the tubular-shaped metal cladding layers by a drawing step to form the compound sheath superconducting wire, the intermediate layer as a brazing material is an alloy made by both tin and at least one of copper, silver, gold, palladium, aluminum, silicon, zinc, iron, nickel, manganese and boron.

2. A superconducting wire comprising:
at least one magnesium boride wire member;
a tubular shaped iron alloy surrounding said at least one magnesium boride wire member;
a copper portion surrounding said at least one magnesium boride wire member and said tubular shaped iron alloy prior to a drawing step to form the superconducting wire; and
an intermediate layer between said tubular shaped iron alloy and said copper portion, wherein said intermediate layer is a junction auxiliary material that is electrically and mechanically unified metallurgically with said tubular shaped iron alloy and copper portion in a unitary structure such that a gap is not formed between the tubular shaped iron alloy and the copper portion by a drawing step to form the superconducting wire, and wherein said intermediate layer is constructed from an alloy made by both tin and at least one of copper, silver, gold, palladium, aluminum, silicon, zinc, iron, nickel, manganese and boron.

3. The superconducting wire of claim 2, wherein said tubular shaped iron alloy directly contacts said at least one magnesium boride wire member.

4. A superconducting wire comprising:
at least one magnesium boride wire member;
a tubular shaped copper portion surrounding said at least one magnesium boride wire member;
an iron alloy surrounding said at least one magnesium boride wire member and said tubular shaped copper portion prior to a drawing step to form the superconducting wire; and
an intermediate layer between said iron alloy and said copper portion, wherein said intermediate layer is a junction auxiliary material that is electrically and mechanically unified metallurgically with said iron alloy and said copper portion in a unitary structure such that a gap is not formed between the iron alloy and the copper portion by a drawing step to form the superconducting wire, and wherein said intermediate layer is constructed from an alloy made by both tin and at least one of copper, silver, gold, palladium, aluminum, silicon, zinc, iron, nickel, manganese and boron.

5. The superconducting wire of claim 4, wherein said tubular shaped copper portion directly contacts said at least one magnesium boride wire member.

* * * * *